United States Patent
Morisada

(10) Patent No.: US 6,903,806 B2
(45) Date of Patent: Jun. 7, 2005

(54) STAGE CONTROL APPARATUS, EXPOSURE APPARATUS, AND DEVICE MANUFACTURING METHOD

(75) Inventor: Masahiro Morisada, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/353,960

(22) Filed: Jan. 30, 2003

(65) Prior Publication Data

US 2003/0147062 A1 Aug. 7, 2003

(30) Foreign Application Priority Data

Feb. 4, 2002 (JP) ............................... 2002-026771

(51) Int. Cl.[7] .................... G03B 27/58; G03B 27/42; G05B 11/01
(52) U.S. Cl. .................... 355/72; 355/53; 318/560
(58) Field of Search .................... 355/53, 75, 72; 318/615, 560, 561, 568.22, 116, 609, 610, 611, 616; 388/806

(56) References Cited

U.S. PATENT DOCUMENTS

| 5,165,047 A | * | 11/1992 | Shimizu | 318/116 |
| 5,184,055 A | * | 2/1993 | Ohishi et al. | 318/615 |
| 5,404,418 A | * | 4/1995 | Nagano | 388/806 |
| 5,475,291 A | * | 12/1995 | Yoshida et al. | 318/568.22 |
| 5,936,710 A | | 8/1999 | Itoh et al. | 355/53 |
| 6,160,612 A | | 12/2000 | Itoh et al. | 355/53 |

FOREIGN PATENT DOCUMENTS

| JP | 5-19858 | 1/1993 |
| JP | 5-35335 | 2/1993 |
| JP | 5-114141 | 5/1993 |
| JP | 5-159492 | 6/1993 |

* cited by examiner

Primary Examiner—Peter B. Kim
(74) Attorney, Agent, or Firm—Fitzpatrick, Cella, Harper & Scinto

(57) ABSTRACT

A stage control apparatus for controlling a motion of a stage. The apparatus includes a filter unit which eliminates a resonance frequency component contained in an input signal and outputs a control signal for controlling a motion of the stage, a generating unit which generates a frequency spectrum of a motion signal concerning a motion of the stage, a calculating unit which calculates coefficients of the filter unit based on the frequency spectrum, and a setting unit which sets the coefficients calculated by the calculation unit as the coefficients of the filter unit.

9 Claims, 8 Drawing Sheets

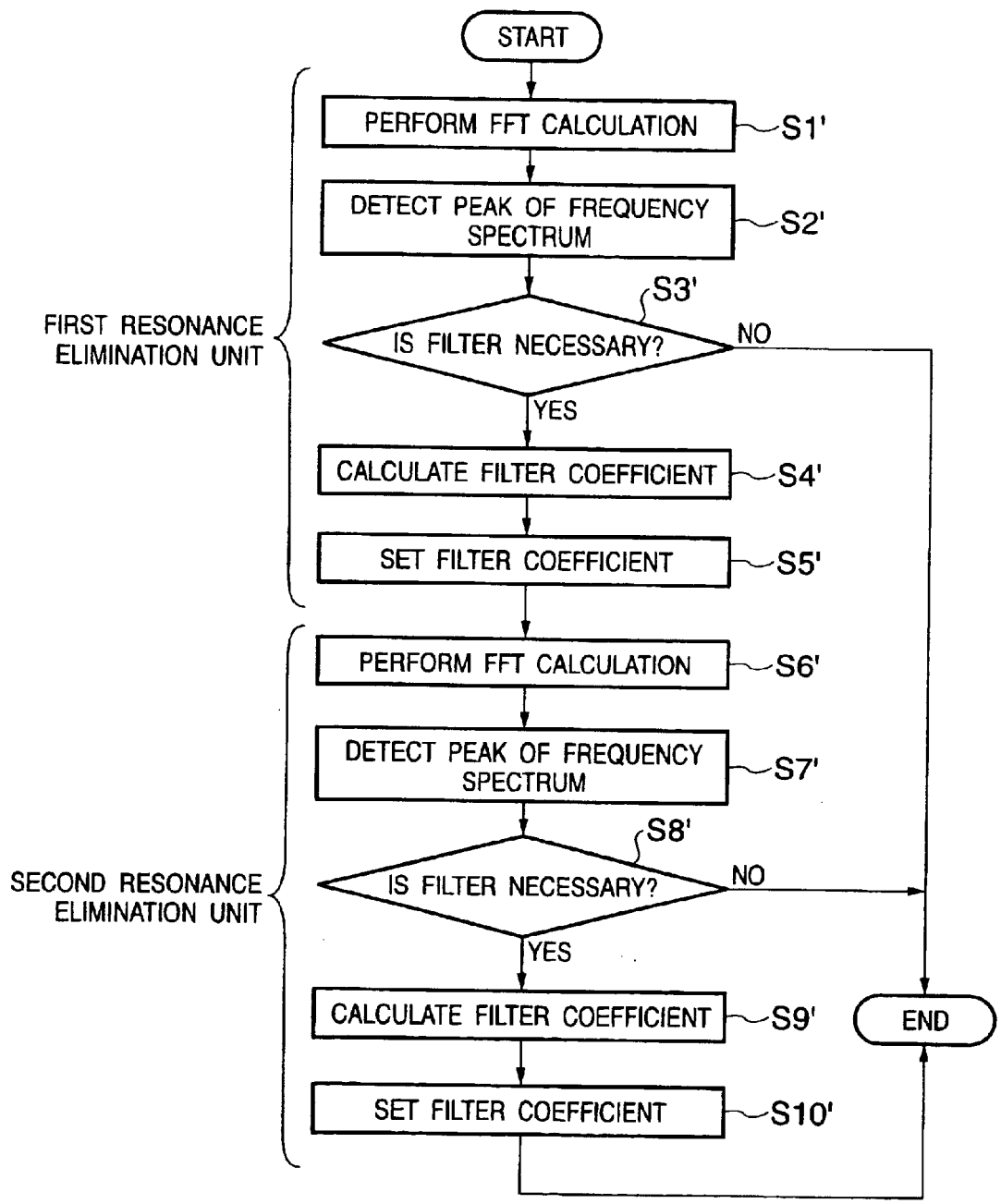

STAGE CONTROL APPARATUS, EXPOSURE APPARATUS, AND DEVICE MANUFACTURING METHOD

FIELD OF THE INVENTION

The present invention relates to a stage control apparatus, an exposure apparatus, and a device manufacturing method.

BACKGROUND OF THE INVENTION

Many devices, including a semiconductor exposure apparatus, are known as a device arranged to position an object on a stage, by which the stage moves on a surface plate. To increase the throughput using these devices, it is necessary to move an object on the stage as fast as possible. However, when the object on the stage is driven at high speed, mechanical resonance of the stage is excited, thereby deteriorating the alignment precision. This deterioration in alignment precision poses a serious problem, especially in a device which demands a high alignment precision in stage movement, such as a scanning exposure apparatus, numerically controlled processing equipment, and the like. For this reason, it is required to meet, in a balanced manner, demands for high-speed stage movement and demands for a high alignment precision.

Mechanical resonance which may occur in stage driving can be suppressed using, e.g., a notch filter. For example, in Japanese Patent Laid-Open No. 5-19858, a frequency-swept AC signal is superposed on a speed command value with respect to the speed control system of a servo actuator, and a frequency at which the amplitude of a torque command value decreases is used as the cutoff frequency of the notch filter. In Japanese Patent Laid-Open No. 5-159492, a notch filter is selected such that the peak of the amplitude of a response signal becomes small when a sine wave is input.

Japanese Patent Laid-Open No. 5-114141 describes a method of calculating the coefficients of a digital notch filter from the characteristic data of a predetermined optical pickup with respect to the tracking servo control system of an optical disk device. Additionally, in Japanese Patent Laid-Open No. 5-35335, a plurality of resonance elimination filters with slightly different cutoff frequencies and cutoff peak values are prepared for a stage control apparatus, and a filter with a cutoff frequency near the resonance frequency is selected when resonance occurs.

However, if a conventional notch filter is employed, a vibration signal needs to be externally superposed on a control system. Hence, a vibration device must separately be provided, and measurement of the resonance frequency and setting of the notch filter must be switched. Also, the mechanical resonance frequency of the stage varies depending on the stage, and thus the cutoff frequency of the notch filter must be adjusted for each stage. If a plurality of resonance elimination filters are used, the coefficients of the plurality of filters must be held as a table. Additionally, if the mechanical resonance frequency has a plurality of peak values, the coefficients of the notch filter must be adjusted for the respective peak values.

SUMMARY OF THE INVENTION

The present invention has been made in consideration of the above-described problems, and has as its object to automatically eliminate a resonance frequency in stage driving on the basis of, e.g., a signal generated in a control system to realize high-speed and high-accuracy stage movement.

According to the first aspect of the present invention, there is provided a stage control apparatus which constitutes at least part of a control system for controlling a stage in an alignment operation, characterized by comprising a compensator which generates a signal for controlling to drive the stage to a target position, a resonance elimination unit which has variable cutoff characteristics and eliminates a resonance frequency component contained in an output signal from the compensator to output the signal as a control signal for controlling the stage, and an adjustment unit which adjusts the cutoff characteristics of the resonance elimination unit, wherein the adjustment unit adjusts the cutoff characteristics of the resonance elimination unit on the basis of a signal generated in the control system.

According to a preferred embodiment of the present invention, the adjustment unit preferably has a frequency analyzer which analyzes the signal generated in the control system and generates a frequency spectrum of the signal, and a frequency setting unit which changes the cutoff characteristics of the resonance elimination unit on the basis of the frequency spectrum generated in the frequency analyzer so as to eliminate the resonance frequency component.

According to a preferred embodiment of the present invention, the frequency analyzer preferably performs a fast Fourier transform for the signal generated in the control system and generates the frequency spectrum of the signal.

According to a preferred embodiment of the present invention, if the frequency spectrum generated in the frequency analyzer includes a plurality of peak values, the frequency setting unit preferably sets one of the plurality of peak values as a cutoff frequency in the cutoff characteristics.

According to a preferred embodiment of the present invention, if the frequency spectrum generated in the frequency analyzer includes a plurality of peak values, the frequency setting unit preferably sets frequencies of the plurality of peak values, respectively, as cutoff frequencies in cutoff characteristics of a plurality of resonance elimination units.

According to a preferred embodiment of the present invention, the frequency setting unit preferably sequentially performs setting of the cutoff characteristics for each of the plurality of resonance elimination units.

According to a preferred embodiment of the present invention, the signal generated in the control system is preferably a signal indicating a current position of the stage.

According to a preferred embodiment of the present invention, the signal generated in the control system is preferably a signal indicating a difference between a target position of the stage and a current position of the stage.

According to a preferred embodiment of the present invention, the signal generated in the control system is preferably an output signal from the compensator.

According to a preferred embodiment of the present invention, the cutoff characteristics preferably include at least one of a cutoff frequency, a cutoff peak value, and a cutoff frequency width.

According to the second aspect of the present invention, there is provided an exposure apparatus, characterized in that a pattern is transferred onto a substrate coated with a photosensitive agent using a stage control apparatus according to the present invention.

According to a preferred embodiment of the present invention, the apparatus preferably further comprises a determination unit which determines whether the resonance frequency component is larger than a predetermined value, and a stop unit which stops operation of the stage when the determination unit determines that the resonance frequency component is larger than the predetermined value.

According to the third aspect of the present invention, there is provided a device manufacturing method, characterized in that a pattern is formed on a substrate using an exposure apparatus according to the present invention.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a flow chart showing the operations of a frequency analyzer and frequency setting unit in FIG. 4;

DETAILED DESCRIPTION OF THE PREFERRED EMBODIMENTS

Figure 1:
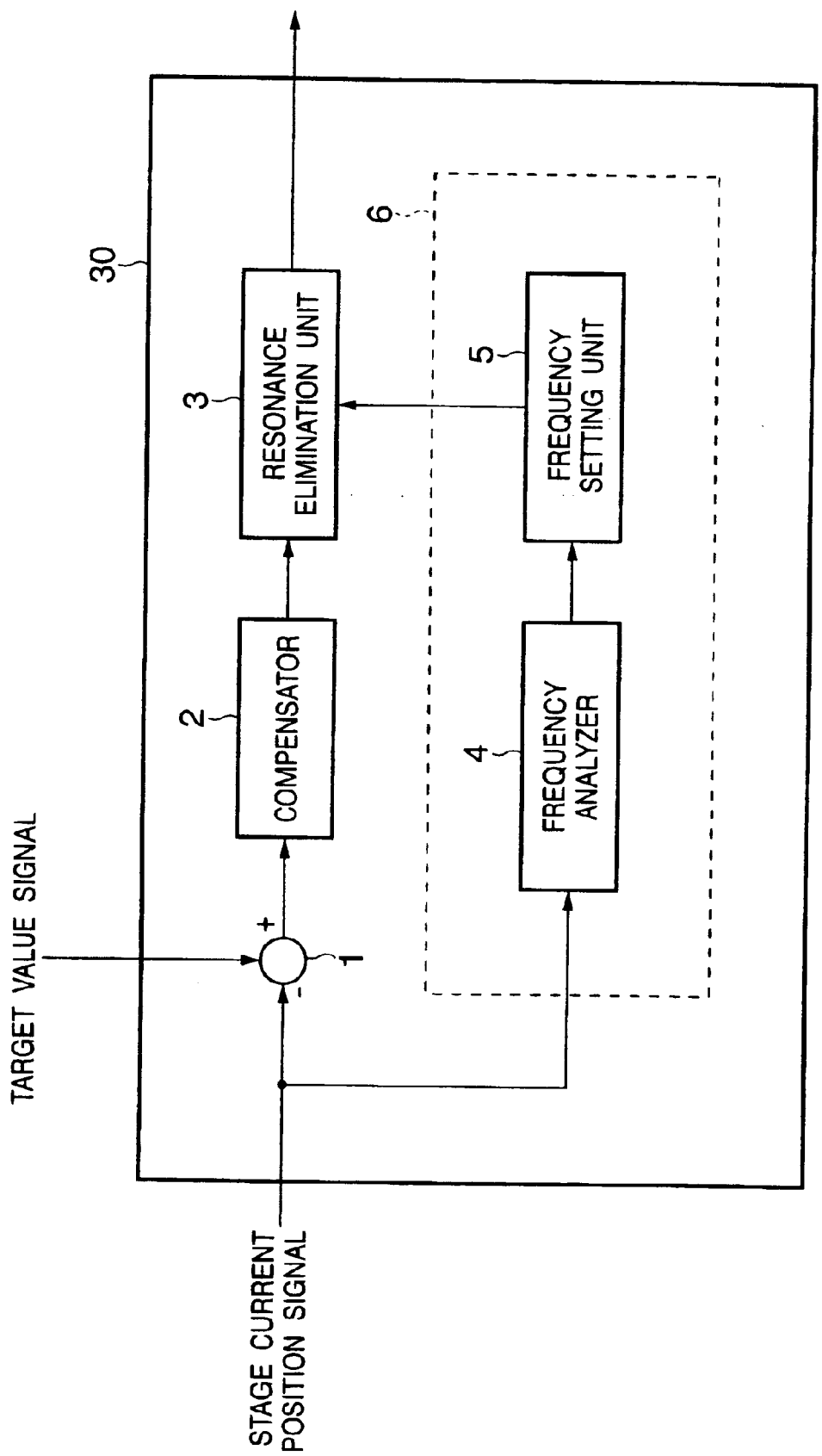
FIG. 1 is a block diagram showing the arrangement of a stage control apparatus according to the first preferred embodiment of the present invention.

Preferred embodiments of the present invention will be described below with reference to the accompanying drawings. Note that the same reference numerals denote the same parts throughout the drawings.

[First Embodiment]

FIG. 1 is a block diagram showing the arrangement of a stage control apparatus 30 according to the first embodiment of the present invention. In the present invention, target value signals include, e.g., a signal indicating the target position of a stage. The stage control apparatus 30 comprises a subtracter 1, which obtains a signal indicating the difference between the target position of the stage and the current position of the stage, a compensator 2, which performs phase compensation for an output from the subtracter 1 by PID compensation, or the like, to compensate for the signal indicating the difference between the target position of the stage and the current position of the stage, a resonance elimination unit 3 having a filter (e.g., a notch filter), which filters and calculates an output from the compensator 2 to eliminate resonance, and an adjustment unit 6, which adjusts the cutoff characteristics of the resonance elimination unit 3 on the basis of the control result.

The adjustment unit 6 includes a frequency analyzer 4, which generates a frequency spectrum to obtained, e.g., the resonance frequency and resonance peak value, and a frequency setting unit 5, which sets the cutoff characteristics of the notch filter such as the cutoff frequency, cutoff peak value, cutoff frequency width, and the like, on the basis of the resonance frequency and resonance peak value obtained in the frequency analyzer 4.

Figure 2:
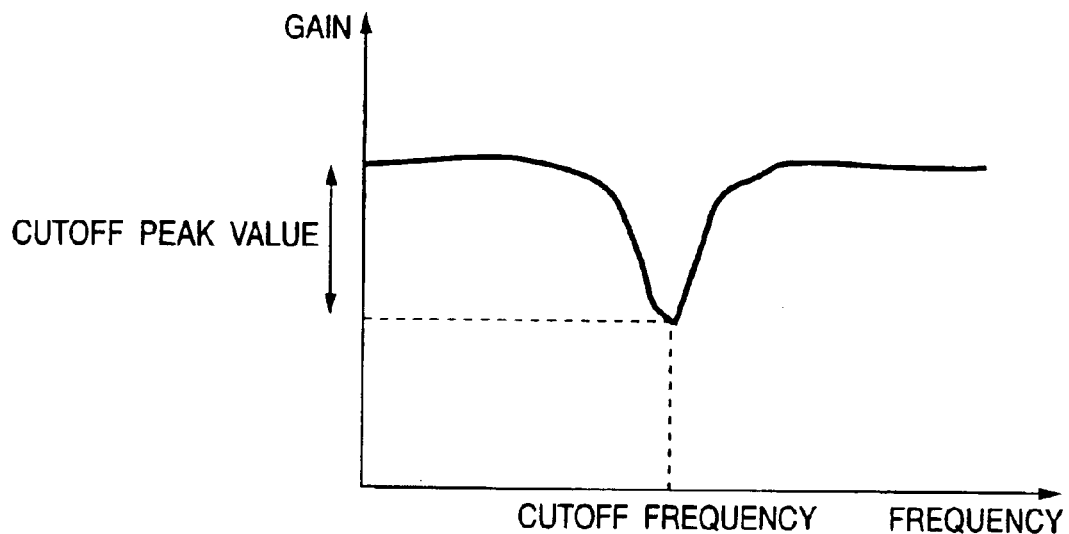
FIG. 2 is a graph showing the frequency characteristic of a resonance elimination unit in FIG. 1.

The resonance elimination unit 3 includes a filter such a notch filter, or the like, which has a predetermined cutoff frequency, e.g., a cutoff frequency, a cutoff peak value, and a cutoff frequency width, and its frequency characteristic is as shown in FIG. 2. Outputs from the resonance elimination unit 3 are passed as outputs of the stage control apparatus 30 to an actuator (not shown) for driving the stage. Though, in this embodiment, the stage control apparatus 30 is implemented as software on a computer, all or part of the stage control apparatus 30 may be implemented by a hardware arrangement.

The processing of suppressing mechanical resonance which may occur upon driving the stage in the stage control apparatus 30 will be described next.

Figure 3:
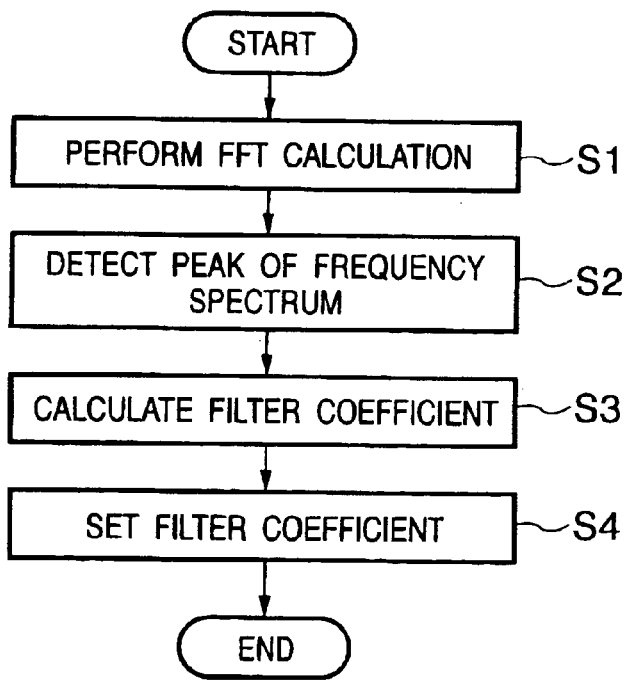
FIG. 3 is a flow chart showing the operations of a frequency analyzer and frequency setting unit in FIG. 1.

FIG. 3 is a flow chart showing the setting operation of the filter coefficients of the resonance elimination unit 3 (e.g., a notch filter) by the frequency analyzer 4 and frequency setting unit 5. The frequency analyzer 4 first performs a fast Fourier transform (FFT) for a signal indicating the current position of the stage and generates a frequency spectrum (step S1). The frequency analyzer 4 then obtains a frequency f1 (the peak of the frequency spectrum) at which the value of the frequency spectrum generated in step S1 reaches the peak (step S2). The frequency analyzer 4 obtains the filter coefficients of, e.g., a filter (e.g., a notch filter) used to eliminate a frequency when resonance occurs (step S3).

The way to obtain the filter coefficients of the notch filter in step S3 will be explained next. The characteristic of the notch filter which eliminates the frequency f1 can be represented by:

$$(s^2+q2 \times wn+wn^2)/(s^2+q1 \times wn+wn^2) \qquad (1)$$

where s is a Laplace operator, $wn=2 \times \pi \times f1$, q1 and q2 are coefficients which are uniquely obtained by the frequency f1, a predetermined peak suppression value h1, and a predetermined cutoff width bw1. Coefficients q1 and q2 are represented by:

$$q1=f1/bw1 \qquad (2)$$

$$q2=q1 \times 10^{(-h1/20)} \qquad (3)$$

When mathematical expression (1) is subjected to bilinear transformation, the discretized characteristic of the notch filter is obtained as follows:

$$(b0+b1z^{-1}+b2z^{-2})/(1+a1z^{-1}+a2z^{-2}) \qquad (4)$$

When the following mathematical expressions:

$$coef1=wn/\tan(wn \times ts/2) \qquad (5)$$

(where ts is a sampling period)

$$coef2=1/(-coef1^2-coef1 \times wn \times q1-wn^2) \qquad (6)$$

hold, coefficients a1, a2, b0, b1, and b2 of the notch filter (mathematical expression (4)) which implements the resonance elimination unit 3 are represented by:

$$a1=2.0\times(\text{coef1}+wn)\times(\text{coef1}-wn)\times\text{coef2} \quad (7)$$

$$a2=-(\text{coef1}\times(\text{coef1}-wn\times q1)+wn^2)\times\text{coef2} \quad (8)$$

$$b0=-(\text{coef1}\times(\text{coef1}+wn\times q2)+wn^2)\times\text{coef2} \quad (9)$$

$$b1=a1 \quad (10)$$

$$b2=-(\text{coef1}\times(\text{coef1}-wn\times q2)+wn^2)\times\text{coef2} \quad (11)$$

As described above, the frequency analyzer 4 obtains a resonance frequency from the frequency spectrum of an input signal using a fast Fourier transform and calculates the filter coefficients of the notch filter which uses the resonance frequency as the cutoff frequency. The frequency setting unit 5 sets the filter coefficients as those of the notch filter (step S4) and thereby can suppress any mechanical resonance which may occur in driving a stage.

The setting operation of the filter coefficients in this embodiment may be performed while the stage control apparatus detects its idle state. The stage control apparatus may include a mechanism of displaying a warning message to the operator when the magnitude of a resonance frequency component, e.g., the peak value of the frequency spectrum generated by the frequency analyzer 4 exceeds a predetermined value.

Though in this embodiment, a cutoff width bw1 is set to a predetermined value, it may change depending on the shape of the frequency spectrum. That is, if the width of the peak is large, the cutoff width bw1 may become large, while if the width is small, the cutoff width bw1 may become small.

In addition, in this embodiment, the frequency analyzer 4 generates a frequency spectrum from a signal indicating the current position of the stage. A method of embodying the present invention is not limited to this. The frequency analyzer 4 may generate a frequency spectrum from a signal which is generated in a control system for controlling the stage, e.g., a signal indicating the difference between the target position of the stage and the current position of the stage, an output signal from a compensator, or other control signals for controlling the stage. In either case, any resonance frequency can be eliminated without superposing a vibration signal on the control system from outside of the control system.

[Second Embodiment]

Figure 4:
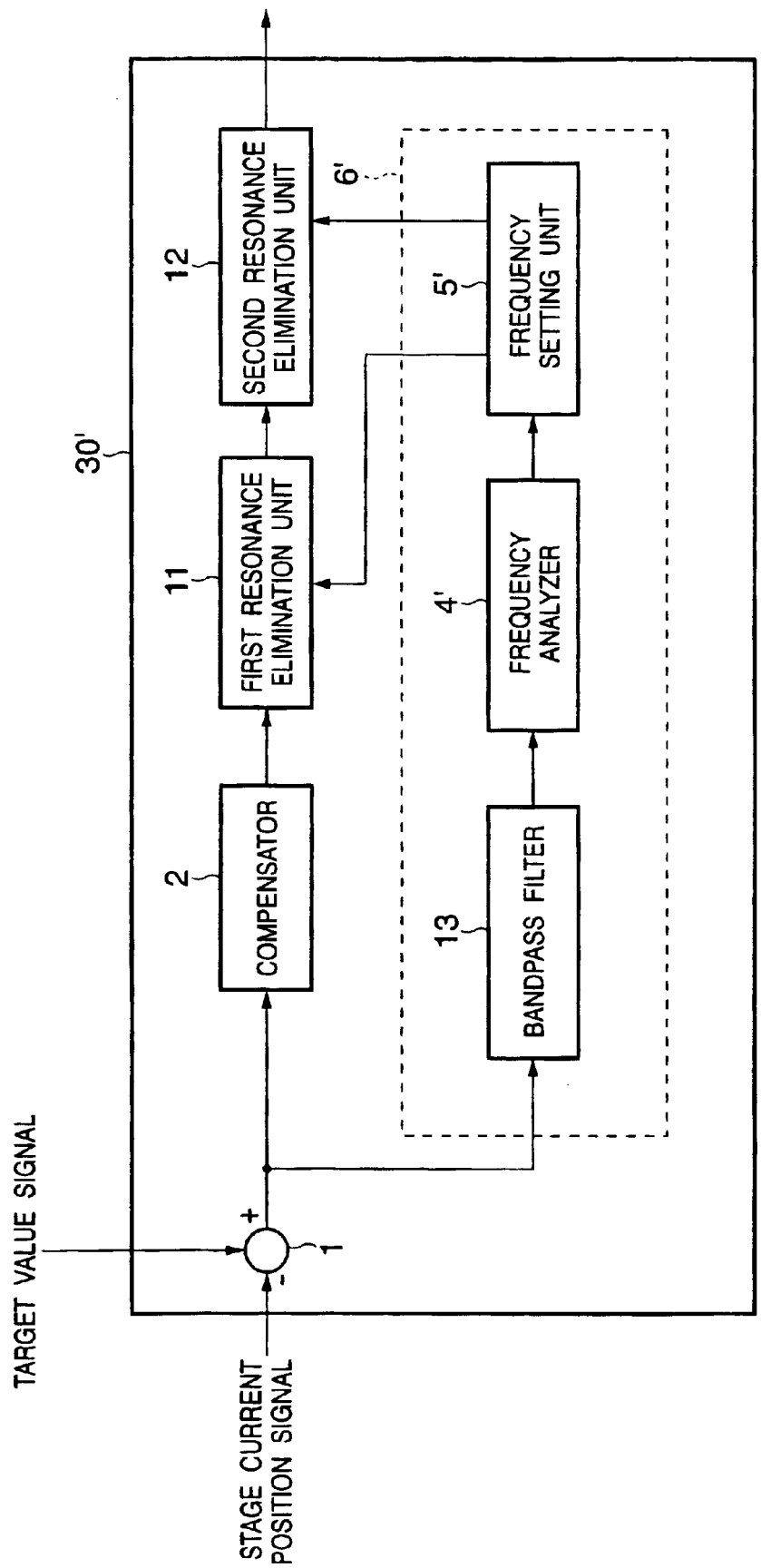
FIG. 4 is a block diagram showing the arrangement of a stage control apparatus according to the second preferred embodiment of the present invention.

FIG. 4 is a block diagram showing the arrangement of a stage control apparatus according to the second embodiment of the present invention. The same reference numerals denote the parts common to the first embodiment.

In FIG. 4, a stage control apparatus 30' comprises a subtracter 1 which obtains a signal indicating the difference between the target position of a stage and the current position of the stage, a compensator 2 which performs a phase compensation calculation for an output from the subtracter 1 by PID compensation, or the like, to compensate for the signal indicating the difference between the target position of the stage and the current position of the stage, a first resonance elimination unit 11 comprised of a filter (e.g., a notch filter) which filters and calculates an output from the compensator 2 to eliminate resonance, a second resonance elimination unit 12, which filters and calculates an output from the first resonance elimination unit 11 to eliminate resonance, and an adjustment unit 6', which changes the cutoff characteristics of the resonance elimination units 11 and 12 on the basis of the control result. The adjustment unit 6' further includes a bandpass filter 13, which eliminates part of the frequency spectrum falling outside a predetermined frequency band in which a resonance peak is expected from the signal indicating the difference between the target position of the stage and the current position of the stage, a frequency analyzer 4', which generates a frequency spectrum to obtain, e.g., the resonance frequency and resonance peak value, and a frequency setting unit 5', which sets the cutoff characteristics of the first resonance elimination unit 11 and second resonance elimination unit 12, such as the cutoff frequency, cutoff peak value, and cutoff frequency width.

Figure 5A:
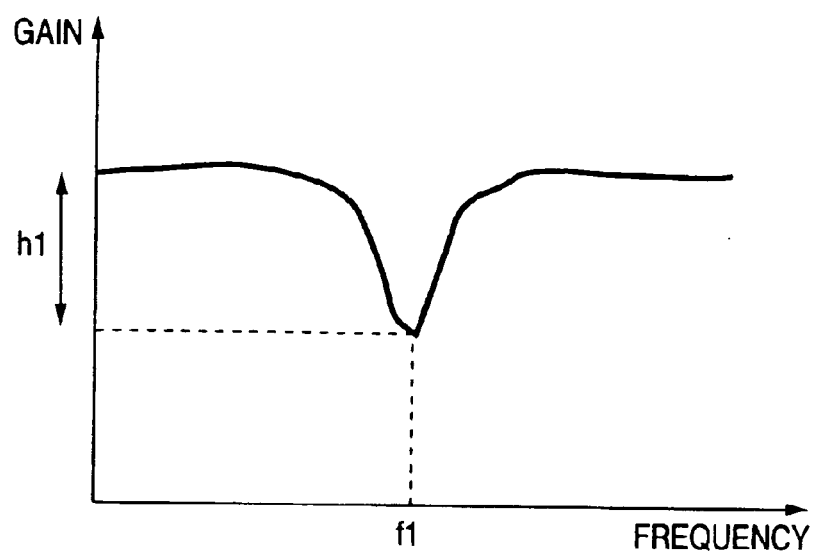
FIG. 5A is a graph showing the frequency characteristic of a resonance elimination unit in FIG. 4.
Figure 5B:
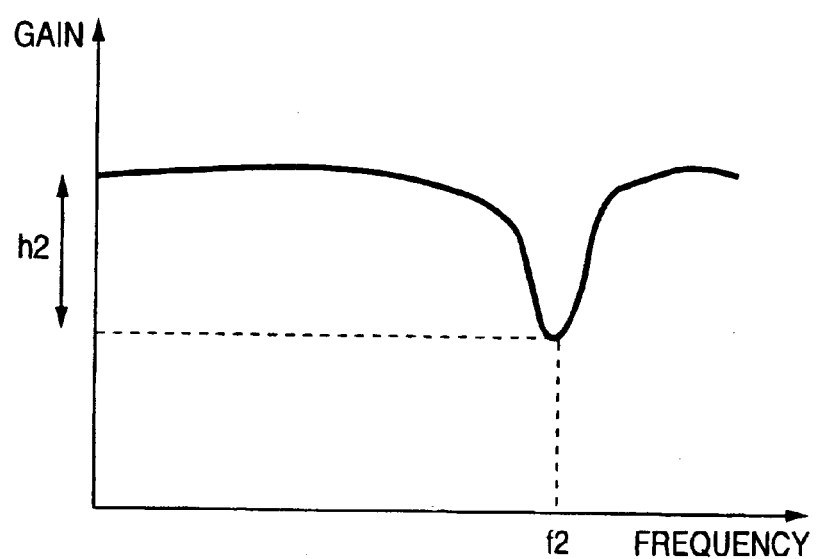
FIG. 5B is a graph showing the frequency characteristic of the resonance elimination unit in FIG. 4.

The resonance elimination units 11 and 12 each are comprised of a filter (e.g., a notch filter), which has predetermined cutoff characteristics, e.g., a cutoff frequency, cutoff peak value, and cutoff frequency width, and their frequency characteristics are as shown in FIGS. 5A and 5B. FIG. 5A shows the frequency characteristic of the resonance elimination unit 11, and FIG. 5B, the frequency characteristic of the resonance elimination unit 12. Frequencies f1 and f2 are respectively set to different frequencies. Outputs from the second resonance elimination unit 12 are passed as outputs of the stage control apparatus 30' to an actuator (not shown) for driving the stages or the like. Though, in this embodiment, the stage control apparatus 30' is implemented as software on a computer, all or part of the stage control apparatus 30' may be implemented by a hardware arrangement.

The processing of suppressing resonance which may occur upon driving the stage in the stage control apparatus 30' according to the second preferred embodiment of the present invention will be explained next.

FIG. 6 is a flow chart showing the setting operation of the filter coefficients in the frequency analyzer 4' and frequency setting unit 5'. The frequency analyzer 4' first performs a fast Fourier transform (FFT) for a signal indicating the difference between the target position of the stage and the current position of the stage in which part of the frequency spectrum falling outside a frequency band with a resonance peak is eliminated by the bandpass filter 13 and generates a frequency spectrum (step S1'). The frequency analyzer 4' then obtains a frequency f1 at which the value of the frequency spectrum generated in step S1' reaches the peak and a peak value p1 of the frequency spectrum (step S2'). The frequency analyzer 4' checks if the peak value p1 is larger than the predetermined value p1 to determine whether a filter is necessary (step S3'). If p1 is larger than $p1_0$, $h1=p1-p1_0$ holds, and the flow advances to step S4'. On the other hand, if p1 is smaller than $p1_0$, the setting operation of filter coefficients ends. If the peak value p1 is larger than the predetermined value $p1_0$ (YES in step S3'), the frequency analyzer 4' calculates, from f1 and h1, coefficients $a1_1$, $a2_1$, $b0_1$, $b1_1$, and $b2_1$ of the notch filters (step S4') represented by:

$$(b0_1+b1_1z^{-1}+b2_1z^{-2})/(1+a1_1z^{-1}+a2_1z^{-2}) \quad (12)$$

Since in this embodiment, two resonance elimination units are used, the coefficients of the notch filters are distinguished from each other by their subscripts. In this embodiment as well, mathematical expressions (2) to (11) as the algorithm of the first embodiment can be used to obtain the coefficients of the notch filters. The frequency setting unit 5' sets the filter coefficients of the first resonance elimination unit 11 (step S5').

Next, the filter coefficients are set for the second resonance elimination unit 12. The frequency analyzer 4' first performs a fast Fourier transform (FFT) for a signal indicating the difference between the target position of the stage and the current position of the stage in which part of the frequency spectrum falling outside a frequency band with a resonance peak is eliminated by the bandpass filter 13 to generate a frequency spectrum (step S6'). Since the filter coefficients of the first resonance elimination unit 11 are already set, the frequency f1 which has been eliminated by the first resonance elimination unit 11 does not appear in the frequency spectrum. The frequency analyzer 4' then obtains a frequency f2 at which the value of the frequency spectrum generated in step S6' reaches the peak and a peak value p2 of the frequency spectrum (step S7'). The frequency analyzer 4' then checks if the peak value p2 is larger than a predetermined value $p2_0$ (step S8') to determine whether a filter is necessary. If p2 is larger than $p2_0$, h2–p2–$P2_0$ holds, and the flow advances to step S9'. On the other hand, if p2 is smaller than $p2_0$, the setting operation of the filter coefficients ends. If the peak value p2 is larger than the predetermined value $p2_0$ (YES in step S8'), the frequency analyzer 4' calculates, from f2 and h2, coefficients $a1_2$, $a2_2$, $b0_2$, $b1_2$, and $b2_2$ (step S9') represented by:

$$(b0_2 + b1_2 z^{-1} + b2_2 z^{-2})/(1 + a1_2 z^{-1} + a2_2 z^{-2}) \tag{13}$$

The coefficients of the notch filter can be calculated by using mathematical expressions respectively obtained by replacing f1 and h1 with f2 and h2 in mathematical expressions (2) to (11) of the first embodiment in the same manner as the calculation of the filter coefficients of the first resonance elimination unit 11. The frequency setting unit 5' sets the filter coefficients of the second resonance elimination unit 12 (step S10').

The initial values of the filter coefficients of the first resonance elimination unit 11 represented by mathematical expression (12) are set to satisfy, e.g., $a1_1=0$, $a2_1=0$, $b1_1=0$, $b2_1=0$, and $b0_1=1$. Also, the initial values of the filter coefficients of the second elimination unit 12 given by mathematical expression (13) are set to satisfy, e.g., $a1_2=0$, $a2_2=0$, $b1_2=0$, $b2_2=0$, and $b0_2=1$. More specifically, inputs to the resonance elimination units 11 and 12 are equal to their outputs in the initial state before setting the filter coefficients.

Since in this embodiment, two resonance elimination units are used, any resonance can be suppressed in a stage which has two mechanical resonance peaks. To determine whether resonance occurs, if one resonance peak exists, the first resonance elimination unit 11 serves as a notch filter, and the filter coefficients of the second resonance elimination unit 12 keep the initial values. Hence, this embodiment can directly be applied to the case of one resonance peak. Additionally, use of the bandpass filter 13 can avoid any erroneous detection of a peak falling outside a frequency band in which a resonance peak is expected.

Though in this embodiment, two resonance elimination units series-connected to each other are used, three or more resonance elimination units may be used. In addition, whether resonance occurs is determined by comparing the peak value of the frequency spectrum with a predetermined value, and it may be determined by comparing the amplitude of a signal indicating the difference of the target position of the stage and the current position of the stage with a predetermined threshold.

In this embodiment, the frequency analyzer 4' generates a frequency spectrum from a signal indicating the difference between the target position of the stage and the current position of the stage. A method of embodying the present invention is not limited to this. The frequency spectrum may be generated by a signal generated in a control system for controlling the stage, e.g., a stage position signal, an output signal from a compensator, or other control signals for controlling the stage. In either case, any resonance frequency can be eliminated without superposing a vibration signal on the control system from the outside of the control system.

As described above, a stage control apparatus of the present invention has one or more resonance elimination units which have variable cutoff characteristics, can generate a frequency spectrum from, e.g., a signal indicating the current position of the stage, a signal indicating the difference between the target position of the stage and the current position of the stage, an output signal from a compensator, or the like. The stage control apparatus can position the stage at high accuracy while suppressing resonance by setting the cutoff characteristics of the resonance elimination units on the basis of a frequency at which the frequency spectrum has a peak, and a peak value.

[Application of Stage Control Apparatus]

An embodiment in which a stage control apparatus according to the present invention is applied to an exposure apparatus used in the manufacturing process of a semiconductor device will be described next.

Figure 7:
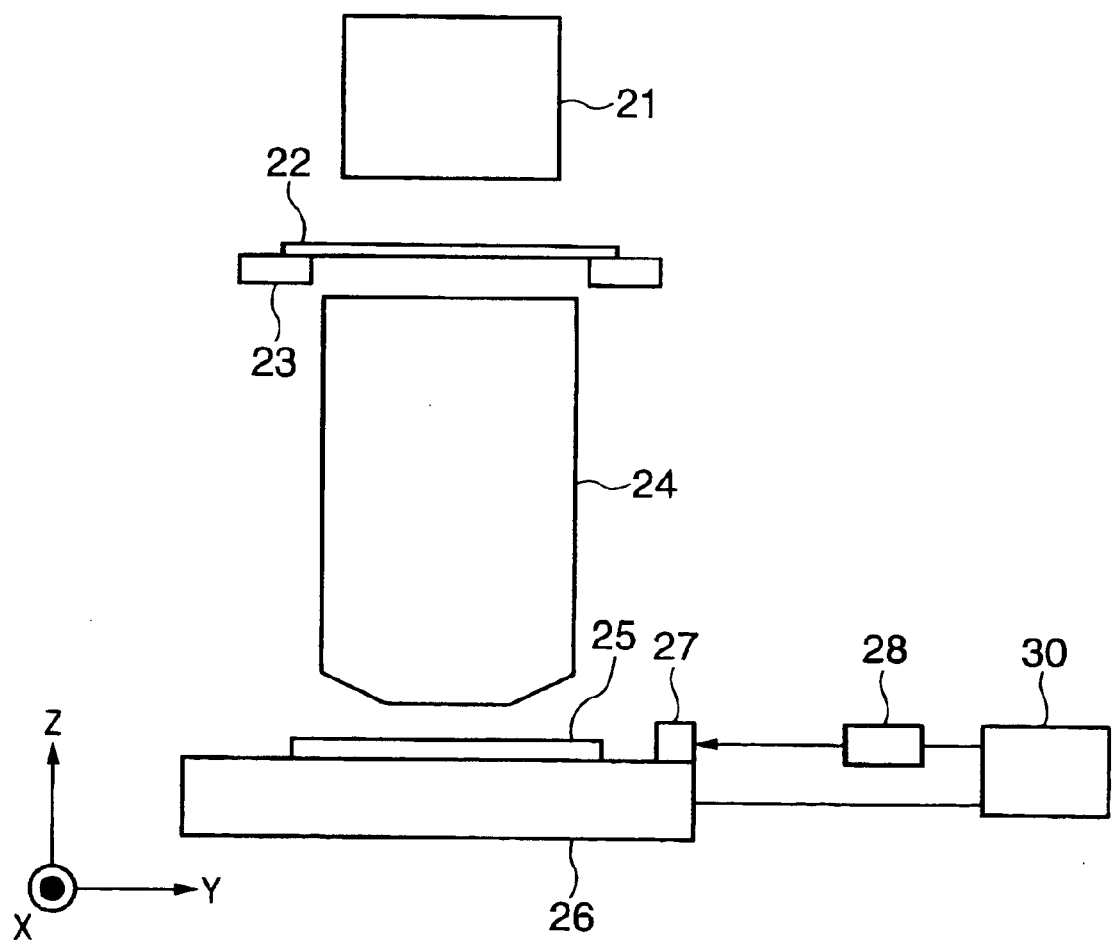
FIG. 7 is a view showing an exposure apparatus using a stage control apparatus according to a preferred embodiment of the present invention.

FIG. 7 shows the concept of an exposure apparatus used when a stage control apparatus according to the present invention is applied to the manufacturing process of a semiconductor device. In FIG. 7, light emitted from an illumination optical system 21 illuminates a reticle 22 as the master. The reticle 22 is held on a reticle stage 23, and the pattern of the reticle 22 is reduced and projected at the magnification of a reduction projection lens 24 to form a reticle pattern image on the image plane. The image plane of the reduction projection lens 24 is perpendicular to the Z direction. The surface of a substrate 25 as a sample to be exposed is coated with resist, and shots formed in the exposure step are laid out on the surface. The substrate 25 is mounted on a substrate stage 26. The substrate stage 26 is comprised of a chuck which fixes the substrate 25, an X–Y stage which can move horizontally in the X and Y directions, and the like. The position information of the substrate stage 26 is constantly measured with respect to a mirror 27 fixed on the substrate stage 26 by a substrate stage interferometer 28. Stage control apparatuses 30 and 30' according to preferred embodiments of the present invention each generate control signals (e.g., output signals from the resonance elimination unit 3 in FIG. 1) using a position signal (e.g., "the current position signal of the stage" in FIG. 1) output from the substrate stage interferometer 28 or the like and controls the position of the substrate stage 26.

Figure 8:
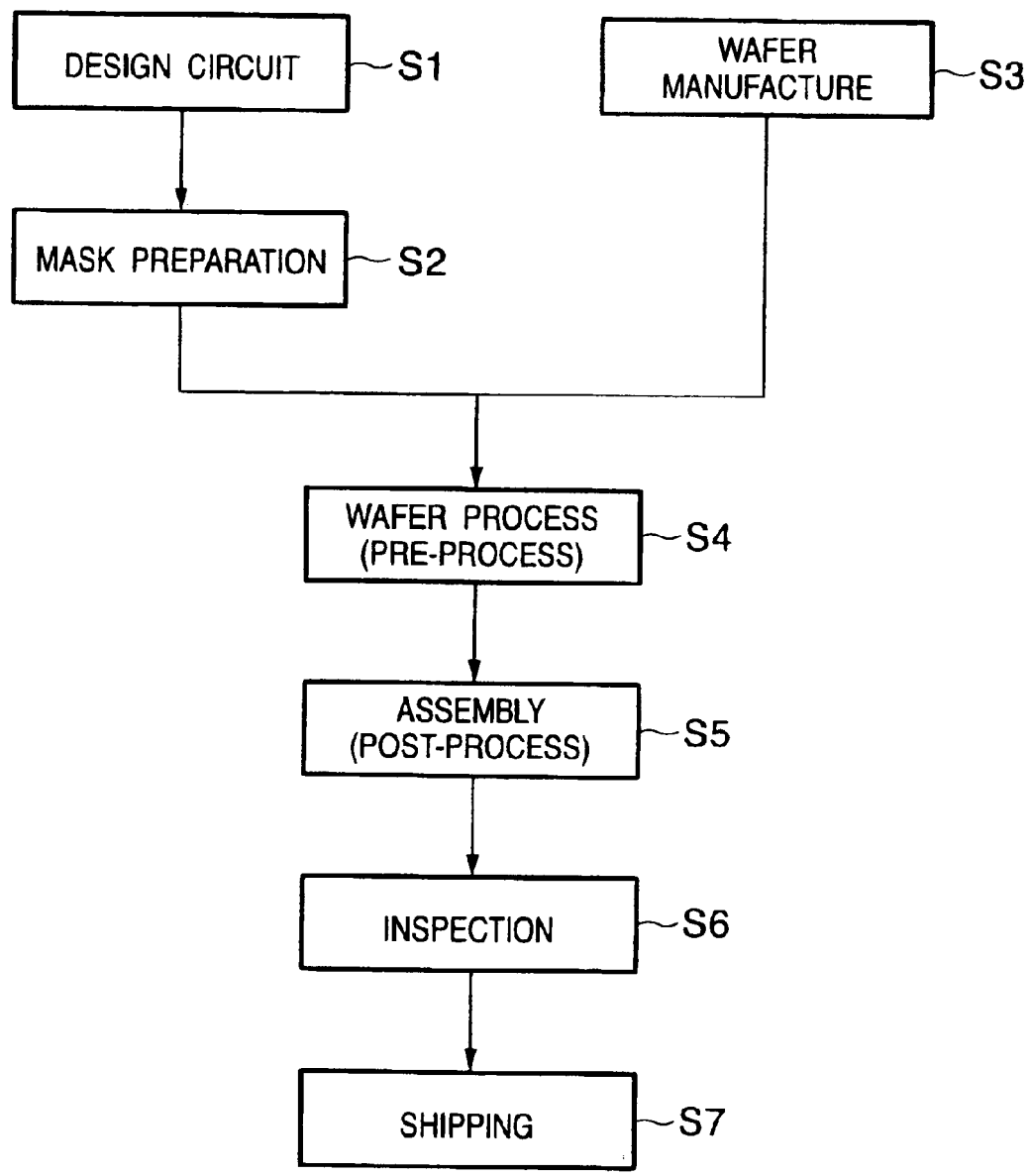
FIG. 8 is a flow chart showing the flow of the whole manufacturing process of a semiconductor device.

FIG. 8 shows the flow of the whole manufacturing process of the semiconductor device using the above-mentioned exposure apparatus. In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process), called a pre-process, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding), and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 9:
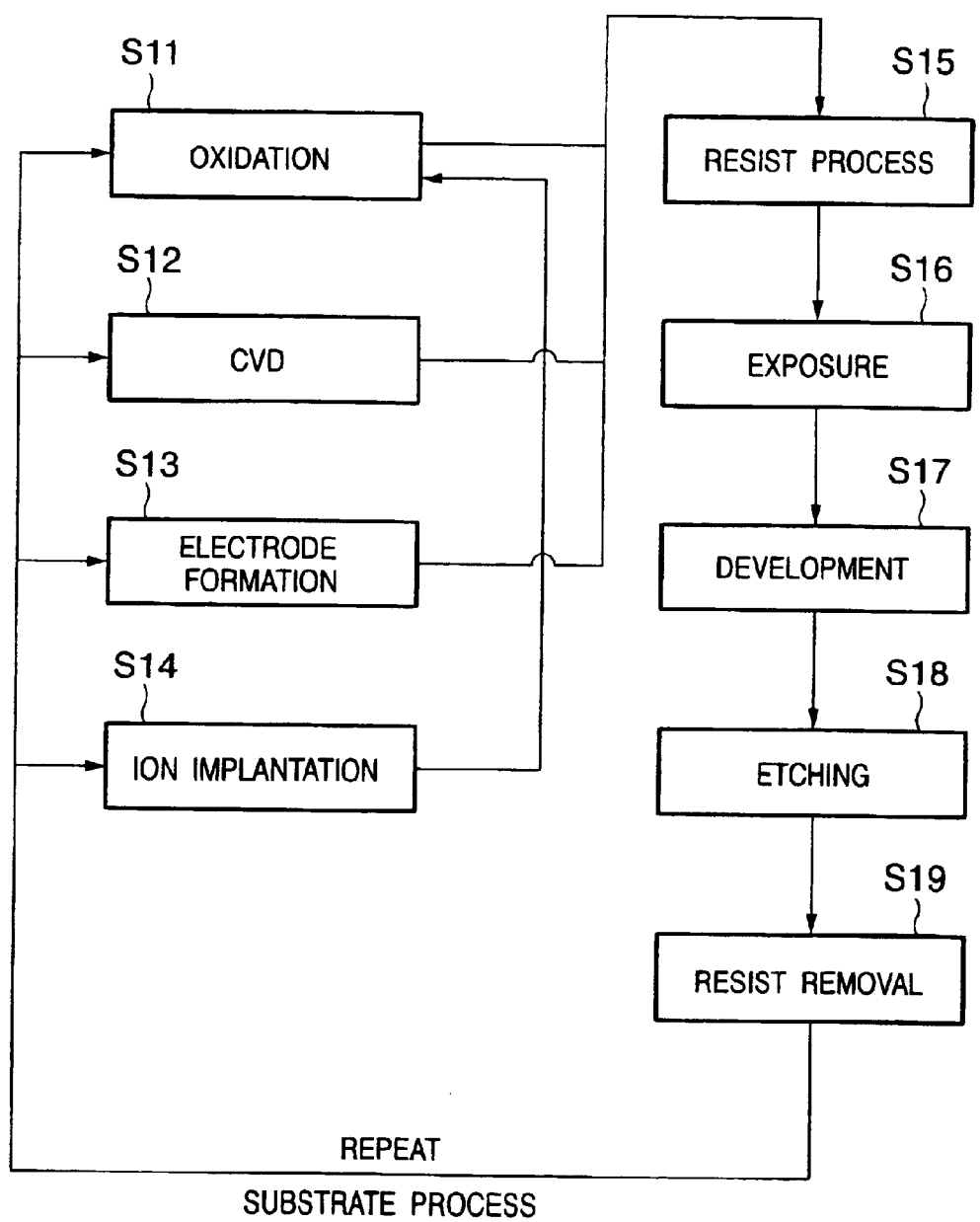
FIG. 9 is a flow chart showing the detailed flow of the wafer process.

FIG. 9 shows the detailed flow of the wafer process. In step 11 (oxidation), the wafer surface is oxidized. In step 12

(CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the wafer is moved at high accuracy using the above-mentioned exposure apparatus, and the circuit pattern is transferred on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

As has been described above, according to a stage control apparatus of a preferred embodiment of the present invention, at least one of the cutoff characteristics, e.g., the cutoff frequency, cutoff peak value, and cutoff frequency width of a resonance elimination unit can be subjected to frequency analysis and can be changed on the basis of the analysis result.

If one resonance elimination unit is used, any resonance of a frequency with a large amplitude can be suppressed by selecting one of a plurality of peak values of a frequency spectrum as the cutoff frequency.

If a plurality of resonance elimination units are used, any resonance can be suppressed by making a plurality of peak values of a frequency spectrum correspond to the cutoff frequencies of the plurality of resonance elimination units. In this case, the cutoff characteristics of the plurality of resonance elimination units may sequentially be set for the respective resonance elimination units.

Assume that a stage control apparatus of the present invention is applied to an exposure apparatus used in the manufacturing step of a semiconductor device. If a resonance frequency component is larger than a predetermined value, the operation of a stage is stopped, and a warning message is displayed. With this operation, unsatisfactory exposure can be avoided in a case wherein resonance cannot be suppressed.

Additionally, in an exposure apparatus according to a preferred embodiment of the present invention, even when the moving speed of a stage is increased, resonance can be suppressed by using the above stage control apparatus. Hence, the throughput in exposure can be increased.

According to the present invention, a resonance frequency in stage driving is automatically eliminated on the basis of a signal generated in a control system. With this operation, high-speed and high-accuracy stage movement can be realized.

As many apparently widely different embodiments of the present invention can be made without departing from the spirit and scope thereof, it is to be understood that the invention is not limited to the specific embodiments thereof except as defined in the claims.

What is claimed is:

1. A stage control apparatus for controlling motion of a stage, said apparatus comprising:

a filter unit, comprising a series of notch filters, which eliminates a resonance frequency component contained in an input signal and outputs a control signal for controlling motion of the stage;

an analyzing unit which generates a frequency spectrum of a motion signal concerning motion of the stage, and calculates coefficients of each of said series of notch filters based on the frequency spectrum; and a setting unit which sets the coefficients calculated by said analyzing unit as the coefficients of each of said series of notch filters.

2. An apparatus according to claim 1, wherein the motion signal is one of a position signal corresponding to a position of the stage, a difference signal corresponding to a difference between a target position of the stage and a position of the stage, and an output signal from a compensator which compensates for the difference signal.

3. An apparatus according to claim 1, wherein said analyzing unit performs a fast Fourier transform on the motion signal and generates the frequency spectrum.

4. An apparatus according to claim 1, wherein said analyzing unit and said setting unit operate with respect to each of said series of notch filters.

5. An apparatus according to claim 1, wherein said analyzing unit calculates the coefficients based on a peak value of the frequency spectrum.

6. An apparatus according to claim 5, further comprising:

a determination unit which determines whether the peak value is larger than a predetermined value; and a stop unit which stops operation of the stage if said determination unit determines that the peak value is larger than the predetermined value.

7. An apparatus according to claim 5, further comprising:

a determination unit which determines whether the peak value is larger than a predetermined value; and a warning unit which warns of said determination unit determining that the peak value is larger than the predetermined value.

8. An exposure apparatus for exposing a substrate to a pattern, said apparatus comprising:

a stage; and a stage control apparatus, for controlling motion of said stage, as recited in claim 1.

9. A device manufacturing method comprising steps of:

exposing a substrate to a patten using an exposure apparatus as recited in claim 8; and developing the exposed substrate.

* * * * *

UNITED STATES PATENT AND TRADEMARK OFFICE
CERTIFICATE OF CORRECTION

PATENT NO. : 6,903,806 B2
DATED : June 7, 2005
INVENTOR(S) : Masahiro Morisada

It is certified that error appears in the above-identified patent and that said Letters Patent is hereby corrected as shown below:

Column 5,
Line 42, "of" should be deleted.

Column 7,
Line 12, "h2-p2-P2$_O$" should read -- h2 = p2-P2$_O$ --.

Column 8,
Line 2, "of" should be deleted.

Column 10,
Line 50, "patten" should read -- pattern --.

Signed and Sealed this

Eleventh Day of October, 2005

JON W. DUDAS
*Director of the United States Patent and Trademark Office*